(12) United States Patent
Kwon et al.

(10) Patent No.: US 10,825,681 B2
(45) Date of Patent: Nov. 3, 2020

(54) 3D CTF INTEGRATION USING HYBRID CHARGE TRAP LAYER OF SIN AND SELF ALIGNED SIGE NANODOT

(71) Applicant: Applied Materials, Inc., Santa Clara, CA (US)

(72) Inventors: Thomas Jongwan Kwon, Dublin, CA (US); Sungwon Jun, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/493,690

(22) Filed: Apr. 21, 2017

(65) Prior Publication Data

US 2018/0047743 A1 Feb. 15, 2018

Related U.S. Application Data

(60) Provisional application No. 62/374,814, filed on Aug. 13, 2016.

(51) Int. Cl.
*H01L 29/06* (2006.01)
*H01L 21/02* (2006.01)
(Continued)

(52) U.S. Cl.
CPC .. *H01L 21/02592* (2013.01); *H01L 27/11524* (2013.01); *H01L 27/11556* (2013.01);
(Continued)

(58) Field of Classification Search
CPC ............. H01L 29/1604; H01L 29/4234; H01L 29/66833; H01L 29/7926; H01L 29/0669; H01L 27/11568; H01L 29/40117
See application file for complete search history.

(56) References Cited

U.S. PATENT DOCUMENTS

| | | | |
|---|---|---|---|
| 6,259,116 B1 * | 7/2001 | Shannon | H01L 27/24 257/16 |
| 6,291,088 B1 * | 9/2001 | Wong | H01L 21/3185 252/62.3 R |

(Continued)

OTHER PUBLICATIONS

Chiang et al; High-Program/Erase-Speed SONOS With In Situ Silicon Nanocrystals; IEEE Electron Device Letters, vol. 29, No. 10, Oct. 2008.

(Continued)

*Primary Examiner* — Charles D Garber
*Assistant Examiner* — S M Sohel Imtiaz
(74) *Attorney, Agent, or Firm* — Patterson & Sheridan LLP

(57) ABSTRACT

Provided are an improved memory device and a method of manufacturing the same. In one embodiment, the memory device may include a vertical stack of alternating oxide layer and nitride layer, the vertical stack having a channel region formed therethrough, a plurality of nanostructures selectively formed on nitride layer of the vertical stack, and a gate oxide layer disposed on exposed surfaces of the channel region, the gate oxide layer encapsulating the plurality of nanostructures formed on the nitride layer. The nanostructures may be a group IV semiconductor compound such as silicon germanium (SiGe).

18 Claims, 2 Drawing Sheets

(51) Int. Cl.
  *H01L 29/04*      (2006.01)
  *H01L 21/28*      (2006.01)
  *H01L 29/423*     (2006.01)
  *H01L 29/788*     (2006.01)
  *H01L 27/11524*   (2017.01)
  *H01L 27/11556*   (2017.01)
  *H01L 29/16*      (2006.01)

(52) U.S. Cl.
  CPC .......... *H01L 29/04* (2013.01); *H01L 29/0669* (2013.01); *H01L 29/40117* (2019.08); *H01L 29/42332* (2013.01); *H01L 29/7889* (2013.01); *H01L 21/0262* (2013.01); *H01L 21/02532* (2013.01); *H01L 21/02601* (2013.01); *H01L 21/02639* (2013.01); *H01L 29/1604* (2013.01)

(56) References Cited

U.S. PATENT DOCUMENTS

| | | | |
|---|---|---|---|
| 6,475,892 B1* | 11/2002 | Bhakta | H01L 21/28017 257/E21.191 |
| 7,119,395 B2 | 10/2006 | Gutsche et al. | |
| 7,787,302 B2 | 8/2010 | Park et al. | |
| 7,897,470 B2 | 3/2011 | Sandhu et al. | |
| 7,955,935 B2 | 6/2011 | Sandhu et al. | |
| 7,964,908 B2 | 6/2011 | Kim et al. | |
| 8,269,268 B2 | 9/2012 | Huo et al. | |
| 8,536,039 B2 | 9/2013 | Chih et al. | |
| 8,686,491 B2 | 4/2014 | Seol | |
| 8,823,075 B2 | 9/2014 | Purayath et al. | |
| 9,484,353 B1* | 11/2016 | Lai | H01L 27/11556 |
| 9,570,551 B1* | 2/2017 | Balakrishnan | H01L 29/0673 |
| 2003/0178617 A1* | 9/2003 | Appenzeller | B82Y 10/00 257/20 |
| 2004/0094794 A1 | 5/2004 | Wu | |
| 2004/0108599 A1* | 6/2004 | Takayama | C23C 14/185 257/763 |
| 2005/0227435 A1* | 10/2005 | Oh | B82Y 10/00 438/257 |
| 2008/0116507 A1* | 5/2008 | Ino | H01L 21/28282 257/324 |
| 2009/0090952 A1* | 4/2009 | Olsen | H01L 21/6719 257/314 |
| 2009/0263962 A1* | 10/2009 | Sandhu | B82Y 10/00 438/594 |
| 2010/0044779 A1* | 2/2010 | Seol | H01L 21/28282 257/326 |
| 2010/0099247 A1* | 4/2010 | Balseanu | H01L 21/3105 438/591 |
| 2010/0117141 A1* | 5/2010 | Shin | G11C 5/02 257/326 |
| 2011/0303972 A1* | 12/2011 | Saitoh | B82Y 10/00 257/329 |
| 2013/0087843 A1* | 4/2013 | Han | B82Y 10/00 257/315 |
| 2013/0307053 A1* | 11/2013 | Polishchuk | H01L 29/4234 257/325 |
| 2014/0151778 A1* | 6/2014 | Purayath | H01L 29/42332 257/316 |
| 2014/0374810 A1* | 12/2014 | Ahn | H01L 27/11551 257/314 |
| 2015/0001610 A1* | 1/2015 | Zhang | H01L 29/792 257/324 |
| 2015/0371709 A1 | 12/2015 | Kai et al. | |
| 2016/0172370 A1* | 6/2016 | Makala | H01L 27/11582 257/314 |
| 2017/0179144 A1* | 6/2017 | Han | H01L 21/76877 |
| 2017/0316968 A1* | 11/2017 | Peidous | H01L 21/76254 |

OTHER PUBLICATIONS

Chakraborty, et al; Nanocrystal Non-volatile Flash Memory Devices: A Simulation Study, IETE Mumbai Centre, NateHCA-07, D-46 through D50.

* cited by examiner

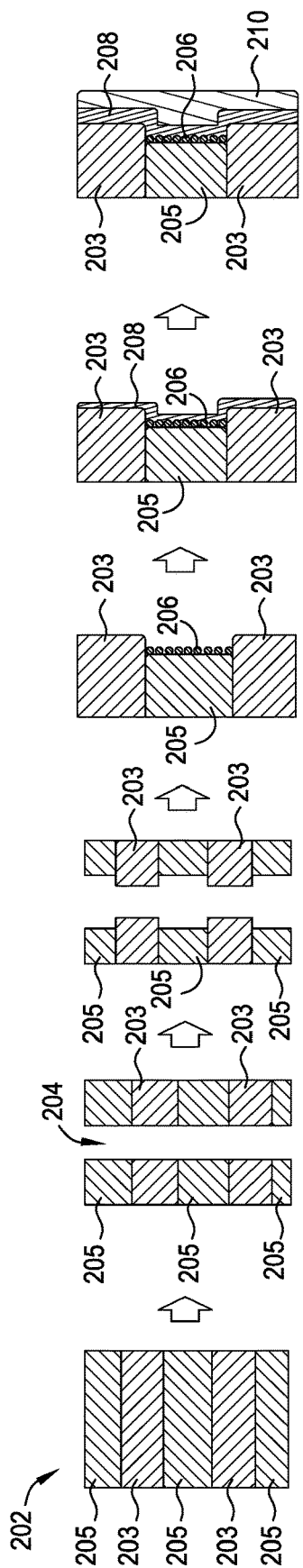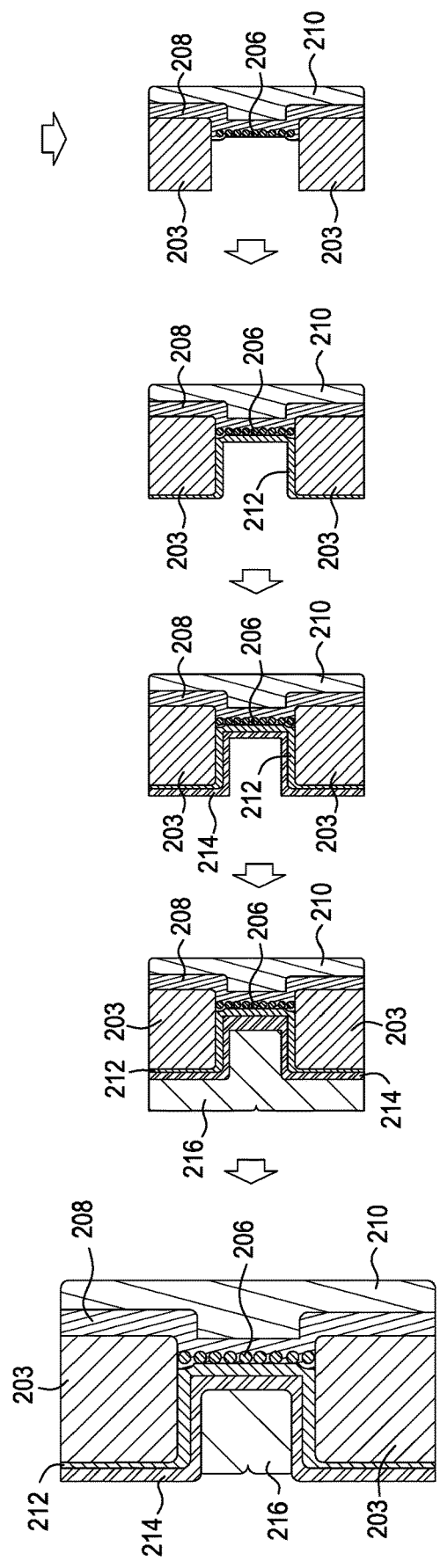

3D CTF INTEGRATION USING HYBRID CHARGE TRAP LAYER OF SIN AND SELF ALIGNED SIGE NANODOT

CROSS-REFERENCE TO RELATED APPLICATIONS

This application claims priority to U.S. provisional patent application Ser. No. 62/374,814, filed Aug. 13, 2016, which is herein incorporated by reference.

FIELD

Embodiments of the present disclosure generally relate to an improved memory device and a method of manufacturing the same.

BACKGROUND

Non-volatile memory devices are semiconductor memory devices that may preserve stored data even when there is no supply of power. One example of non-volatile memory devices is flash memory device. Each of a plurality of memory cells constituting flash memory may include a cell transistor having a gate structure in which a floating gate storing charges, and a control gate controlling the floating gate may be sequentially stacked.

In order to satisfy the demand for expanding the memory capacity of the flash memory device, the size of the memory cells has been reduced. In addition, a height of the floating gate in a vertical direction has been reduced. However, the size of the floating gate may limit the reduction in the size of the flash memory device. In order to deal with this limitation, a charge trap flash (CTF) memory device including a charge trap layer instead of a floating gate has been developed. The CTF memory device may utilize a shifting threshold voltage as charges are trapped in the charge trap layer. The CTF memory device may be smaller than a flash memory device that stores charges in a floating gate.

However, CTF memory devices are reported to have charge retention issues because their charge retention capability are sensitive to defects in a tunneling dielectric layer that is typically disposed underneath the charge trapping layer. Defects that are present in the tunneling dielectric layer can allow charges to leak from a floating gate transistor. Thus, further scaling of devices by reducing the thickness of the tunnel dielectric layer can increase the risk of defects in the tunneling dielectric layer and accordingly decrease charge retention capabilities of the charge trapping layer.

Therefore, there is a need in the art to provide an improved CTF memory device that addresses the above-mentioned issues.

SUMMARY

Embodiments of the present disclosure provide an improved memory device and a method of manufacturing the same. In one embodiment, the memory device includes a vertical stack of alternating oxide layer and nitride layer, the vertical stack having a channel region formed therethrough, a plurality of nanostructures selectively formed on nitride layer of the vertical stack, and a gate oxide layer disposed on exposed surfaces of the channel region, the gate oxide layer encapsulating the plurality of nanostructures formed on the nitride layer. The nanostructures may be a group IV semiconductor compound such as silicon germanium (SiGe).

In another embodiment, a method of fabricating a memory cell includes forming a channel region through a vertical stack of alternating oxide layer and nitride layer, selectively growing a plurality of group IV semiconductor nanostructures on the nitride layer inside channel region of the vertical stack, and forming a gate oxide layer on exposed surfaces of the channel region, the gate oxide layer encapsulating the plurality of group IV nanostructures formed on the nitride layer.

In yet another embodiment, the memory device includes a channel layer formed over a substrate, a first oxide layer formed on the channel layer, wherein the first oxide layer having a plurality of group IV semiconductor nanostructures disposed thereon, a second oxide layer formed on the first oxide layer, the second oxide layer having a trench extended through the second oxide layer to expose the plurality of group IV semiconductor nanostructures, a nitride layer conformally formed on exposes surfaces of the second oxide layer and the plurality of group IV semiconductor nanostructures, wherein the plurality of group IV semiconductor nanostructures are embedded between the nitride layer and the first oxide layer, a third oxide layer conformally formed on the nitride layer, and a metal gate layer formed on the third oxide layer within the trench.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIGS. 2A-2K depict perspective views of a simplified, conceptual memory device during various stages of fabrication according to the flow chart of FIG. 1.

Figure 1:
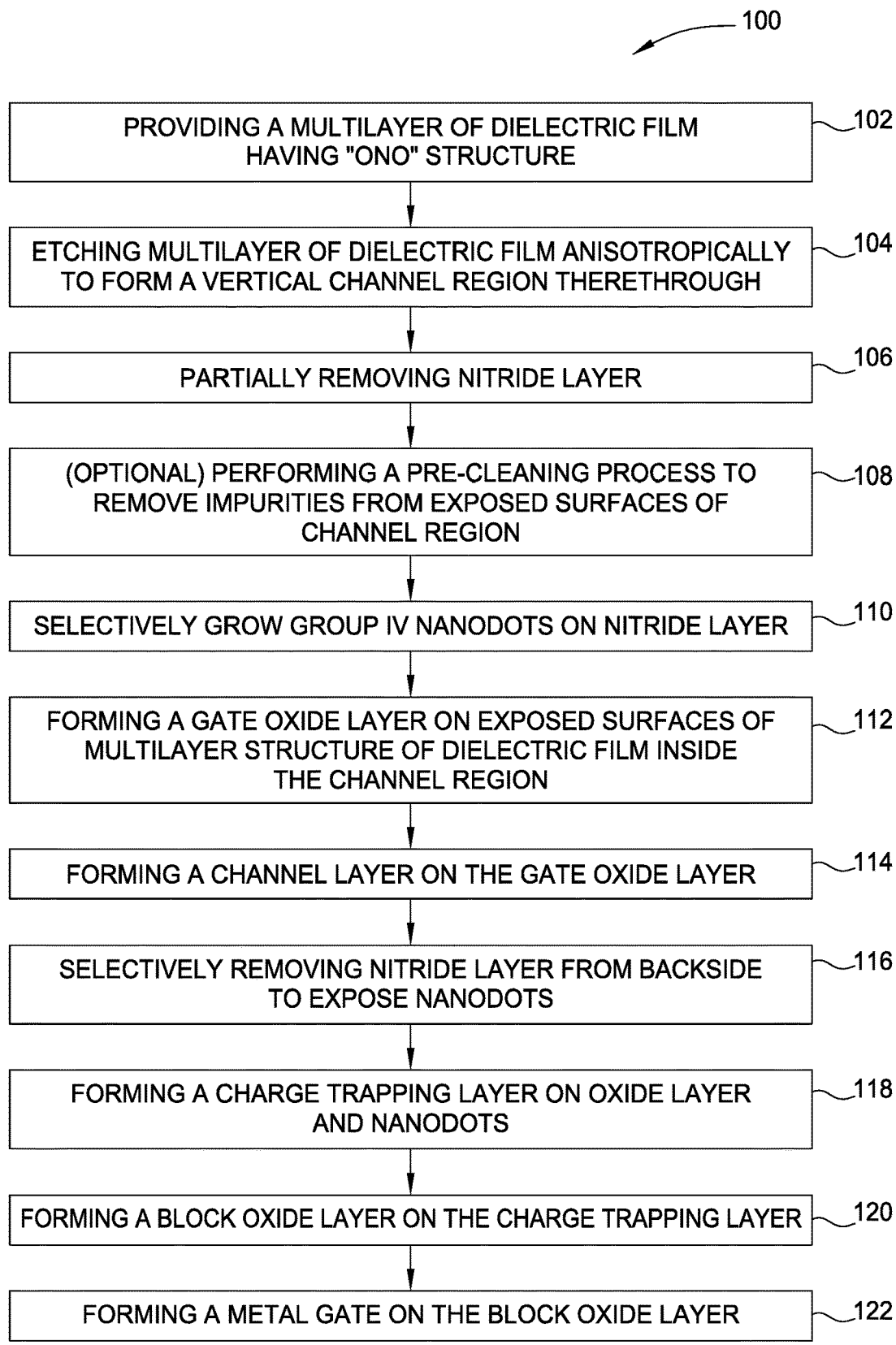
FIG. 1 depicts a flow chart of a method for manufacturing a memory device according to embodiments of the disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

FIG. 1 depicts a flow chart of a method 100 for manufacturing a memory device according to embodiments of the disclosure. FIG. 1 is illustratively described with reference to FIGS. 2A-2K, which show perspective views of a simplified, conceptual memory device during various stages of fabrication according to the flow chart of FIG. 1. Those skilled in the art will recognize that the structures FIGS. 2A-2K, while generally drawn to illustrate approximate relative sizes or dimensions for ease of understanding, are not drawn to scale. Those skilled in the art will further recognize that the well-known processes for forming a transistor circuit and the associated structures are not illustrated in the drawings or described herein. Instead, for simplicity and clarity, only so much of a process for forming a transistor circuit and the associated structures as is unique to the present disclosure or necessary for an understanding of the present disclosure is depicted and described. In addition, although various steps are illustrated in the drawings and described herein, no limitation regarding the order of such steps or the presence or absence of intervening steps is implied. Steps depicted or described as sequential are, unless explicitly specified, merely done so for purposes of explanation without precluding the possibility that the respective steps are actually performed in concurrent or overlapping manner, at least partially if not entirely.

The method 100 begins at block 102 by providing a multilayer structure of dielectric film 202, as shown in FIG. 2A. The multilayer structure of dielectric film 202 may have a vertical stack of alternating oxide layer 203 and nitride layer 205, forming an oxide-nitride-oxide-nitride-oxide ("ONO") structure. The oxide and nitride layers may be any suitable oxides and nitrides. In one embodiment as shown, the oxide layer 203 is silicon oxide and the nitride layer 205 is silicon nitride. While not shown, it is contemplated that the multilayer structure of dielectric film 202 can have any desired number of oxide and nitride layers, such as 12 or more pairs of alternating oxide layer and nitride layer pairs, for example 16 or more pairs of alternating oxide layer and nitride layer pairs.

At block 104, the multilayer structure of dielectric film 202 is etched anisotropically to form a vertical channel region 204 therethrough, as shown in FIG. 2B.

At block 106, the nitride layer 205 is partially removed using an etch process that is selective to the nitride layer 205 over the oxide layer 203. Upon completion of etching the nitride layer 205, the nitride layer 205 is slightly recessed laterally as compared to the oxide layer 203, as shown in FIG. 2C.

At block 108, an optional pre-clean process is performed to remove impurities such as native oxides from the exposed surfaces of the channel region 204. The pre-clean process can be performed by using a cleaning solution such as dilute hydrofluoric acid (DHF), or a SPM solution including sulfuric acid ($H_2SO_4$), hydrogen peroxide ($H_2O_2$), and deionized water (DI water).

At block 110, a selective growth process is performed to form a plurality of nanodots 206 on the nitride layer 205, as shown in FIG. 2D. The nanodots 206 may be evenly distributed on the exposed surface of the nitride layer 205. For clarity purposes, only a portion of the multilayer structure of dielectric film 202 is depicted in FIG. 2D. The nanodots 206 herein refer to nanostructures having a size of a nanometer order. Nanodots may also be referred to as nanoparticles, quantum dots (nanostructure with quantum confinement), or nanocrystals (having a crystalline structure). These nanostructures are small particles in any shape that can be formed with charge-storing capabilities. As device dimensions continue to be scaled-down, the small size of nanostructures makes them suitable for forming charge storage regions, such as the floating gates for nonvolatile memory cells. The nanodots 206 may have a characteristic dimension that is less than about 100 μm, for example less than 10 μm, or even less than 1 μm. In some embodiments, each of these nanodots 206 may have a dimension less than 10 μm. While nanodots are described in this disclosure, it is contemplated that other nanostructures, such as, for example, nanowires, nanotubes, or nanotetrapods etc., may also be used to replace the nanodots. In this disclosure, nanostructures can be, for example, substantially crystalline, substantially mono-crystalline, poly-crystalline, amorphous or a combination thereof.

The nanodots 206, as shown in FIG. 2D, are comprised of substantially spherical nanostructures. The nanodots 206 can be comprised of essentially any material. In various embodiments, the nanodots 206 may be a group IV semiconductor compound, a group II-VI semiconductor compound, a group III-V semiconductor compound, a metal or a metal alloy, or a high-K material. The nanodots 206 may be formed using a low-pressure chemical vapor deposition (LPCVD), a chemical vapor deposition (CVD), an atomic layer deposition (ALD), a physical vapor deposition (PVD), or any other suitable process such as ion implantation.

In one embodiment, the nanodots 206 are silicon germanium (SiGe), either in substantially crystalline or amorphous. Optionally, an amorphous silicon layer may be firstly deposited on the exposed surfaces of the multilayer structure of dielectric film 202 inside the channel region 204 to promote deposition of SiGe on the nitride layer 205 over the oxide layer 203. It has been observed that due to germanium intermixing with the amorphous silicon layer, agglomeration of amorphous silicon and silicon germanium would result in only formation of the nanodots 206 on the nitride layer 205, with minimum or zero deposition of nanodots 206 on the oxide layer 203. The preferential agglomeration to the nitrides than oxides may be due to nitride with more dangling bonds available, providing better nucleation site than the oxide surface. The concentration of germanium in SiGe may be above 20%, for example about 30% or more, such as about 45% or more. Different germanium concentrations can be obtained by varying the germanium-containing precursor gas flow rates with a constant silicon-containing precursor gas flow. The kinetics of intermixing is more prominent as Ge concentrations increase and the adjacent amorphous silicon layer thickness are thinner (e.g., less than 50 angstrom, such as 30 angstrom or less). In one exemplary embodiment, the SiGe nanodots are formed using a chemical vapor deposition process where a silicon-containing precursor gas and a germanium-containing precursor gas are reacted at a temperature of about 400° C. to about 650° C., for example about 550° C., and a chamber pressure of about 20 Torr to about 100 Torr, for example about 50 Torr, to selectively deposit SiGe on the nitride layer 205.

Suitable silicon-containing precursor gas may include one or more of silanes, halogenated silanes or organosilanes. Silanes may include silane ($SiH_4$) and higher silanes with the empirical formula $Si_xH_{(2x+2)}$, such as disilane ($Si_2H_6$), trisilane ($Si_3H_5$), and tetrasilane ($Si_4H_{10}$), or other higher order silane such as polychlorosilane. Halogenated silanes may include compounds with the empirical formula $X'_ySi_xH_{(2x+2-y)}$, where X'=F, Cl, Br, or I, such as hexachlorodisilane ($Si_2Cl_6$), tetrachlorosilane ($SiCl_4$), dichlorosilane ($Cl_2SiH_2$) and trichlorosilane ($Cl_3SiH$). Organosilanes may include compounds with the empirical formula $R_ySi_xH_{(2x+2-y)}$, where R=methyl, ethyl, propyl or butyl, such as methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$) and hexamethyldisilane (($CH_3$)$_6Si_2$). Suitable germanium-containing gases may include, but are not limited to germane ($GeH_4$), digermane ($Ge_2H_6$), trigermane ($Ge_3H_5$), or a combination of two or more thereof.

At block 112, a gate dielectric or gate oxide layer 208 is formed on exposed surfaces of the multilayer structure of dielectric film 202 inside the channel region 204, as shown in FIG. 2E. The gate oxide layer 208 may be a thin layer conformally covering the nanodots 206 formed on the nitride layer 205. Therefore, the nanodots 206 is embedded or encapsulated within the gate oxide layer 208. The gate oxide layer 208 separates or electrically isolates a sequentially formed charge trapping layer (i.e., the charge trapping layer 212 having nanodots 206 embedded therein, see FIG. 2H) from a channel region (not shown) of the memory device disposed between source and drain regions. The gate oxide layer 208 may be made of silicon oxide, silicon dioxide or any other materials having high dielectric constant (K). The gate oxide layer 208 may be formed by an ALD process or any suitable process such as a thermal oxidation process. The gate oxide layer 208 may have a thickness of about 800 µm or less, for example about 500 µm or less, or even 200 µm or less. A thinner gate oxide layer permits the use of lower programming and erasing voltages, allowing for better charge retention as compared to conventional floating-gate electrically erasable programmable read-only memory devices.

At block 114, a channel layer 210 is formed on the gate oxide layer 208, as shown in FIG. 2F. The channel layer 210 may be made of any group IV semiconductor such as silicon or germanium, any group III-V compounds, such as gallium nitride (GaN), any group II-VI semiconductor compound, or any group III-V semiconductor compound. In one embodiment as shown, the channel layer 210 is a polycrystalline silicon layer.

At block 116, after the channel layer 210 is formed, the nitride layer 205 is selectively removed from the backside (i.e., a side opposing the channel region 204). The nitride layer 205 may be removed by using a slit photolithography process that is selective to the nitride layer 205 over the oxide layer 203, followed by an etch process using a diluted hydrofluoric acid (HF) solution to remove the nitride layer 205 and expose portions of the nanodots 206 disposed between the nitride layer (now removed) and the gate oxide layer 208, as shown in FIG. 2G.

At block 118, a conformal charge trapping layer 212 is formed on exposed surfaces of oxide layer 203 and the exposed nanodots 206 on the back side of the multilayer structure of dielectric film 202, as shown in FIG. 2H. The nanodots 206 are embedded in the charge trapping layer 212 as a result of formation of the charge trapping layer 212. The charge trapping layer 212 may be silicon nitride formed by a LPCVD process or an ALD process using a silicon-containing precursor gas, such as a dichlorosilane ($SiH_2Cl$), and a nitrogen-containing precursor gas, such as ammonia ($NH_3$). The charge trapping layer 212 may have a thickness of about 1 µm to about 10 µm, for example about 5 µm.

At block 120, a conformal block oxide layer 214 is formed on the charge trapping layer 212, as shown in FIG. 2H. The block oxide layer 214 may be a silicon oxide layer. In some embodiments, the block oxide layer 214 may be made of materials including metal oxide, such as aluminum oxide. The block oxide layer 214 may be formed by a LPCVD process or any other suitable deposition process. The block oxide layer 214 may have a thickness of about 1 µm to about 10 µm, for example about 5 µm.

At block 122, a metal deposition process is performed to form a metal gate layer 216 on the block oxide layer 214, as shown in FIG. 2J. The metal gate layer 216 may have a thickness of about 100 µm to about 350 µm, for example about 200 µm. The metal gate layer 216 may be any electrically conductive material, such as metal or a metal alloy. Examples of a metal or metal alloy for use as a metal gate layer 216 may include, but is not limited to, aluminum, copper, tungsten, tantalum, titanium, cobalt, and any combinations thereof, and alloys of tungsten, aluminum, copper, cobalt and any combinations thereof. Thereafter, the metal gate layer 216 outside the trench 218 is removed to separate the metal gate layer from that of other memory cells, as shown in FIG. 2K.

After block 122, a plurality of fabrication techniques may be employed to complete the memory device. For example, a lithography/etching process may be performed to pattern the metal gate layer 216, the block oxide layer 214, the charge trapping layer 212, and the gate oxide layer 208. A plurality of successive ion implantation processes may then be carried out to form a source/drain region (not shown) in or adjacent the channel layer 210. Subsequently, the source/drain region is activated by a laser annealing process.

Benefits of the present disclosure include an improved charge trap flash (CTF) memory device having silicon germanium (SiGe) nanodots selectively grown on nitrides of oxide-nitride-oxide-nitride-oxide ("ONO") structure. The use of charge trapping layer having SiGe nanodots embedded therein increase charge retention capability of the charge trapping layer, and reduces the issues of charge retention loss encountered in conventional floating-gate electrically erasable programmable read-only memory devices. It also allows for thinner gate oxide layer to be disposed underneath the charge trapping layer and, thereby, allowing for smaller operating voltages, better endurance and retention, and faster program/erase speed.

While the foregoing is directed to embodiments of the present disclosure, other and further embodiments of the disclosure may be devised without departing from the basic scope thereof.

The invention claimed is:

1. A three dimensional charge trap flash memory device, comprising:
   a vertical stack of alternating oxide layers and nitride layers stacked in a first direction, the vertical stack having a channel region formed through the vertical stack in the first direction, wherein an exposed surface of each nitride layer is recessed in the channel region with respect to exposed surfaces of adjacent two oxide layers;
   a plurality of nanostructures selectively formed directly on the exposed surfaces of the nitride layers of the vertical stack in the channel region and distributed along the first direction; and
   a gate oxide layer disposed on the exposed surfaces of the oxide layers and the nitride layers within the channel region along the first direction and encapsulating the plurality of nanostructures formed on the exposed surfaces of the nitride layers.

2. The memory device of claim 1, wherein the nanostructures comprise a group IV semiconductor compound, a group II-VI semiconductor compound, a group III-V semiconductor compound, a metal, a metal alloy, or a high-K material.

3. The memory device of claim 2, wherein the nanostructures are silicon germanium (SiGe).

4. The memory device of claim 3, wherein a concentration of germanium in SiGe is 20% or greater.

5. The memory device of claim 1, wherein the nanostructures have a crystalline structure.

6. The memory device of claim 1, wherein the nanostructures have an amorphous structure.

7. The memory device of claim 1, wherein the nanostructures have a characteristic dimension less than 100 µm.

8. The memory device of claim 1, wherein the nanostructures comprise nanodots, nanowires, nanotubes, or nanotetrapods.

9. The memory device of claim 1, wherein the gate oxide layer has a thickness of 500 μm or less.

10. A three dimensional charge trap flash memory device, comprising:
- a vertical stack of oxide layers spaced apart in a first direction and having a channel region formed through the vertical stack in the first direction;
- a gate oxide layer formed on surfaces of the oxide layers within the channel region and in spaces between adjacent oxide layers of the vertical stack;
- a plurality of nanostructures embedded in the gate oxide layer and distributed in the first direction between adjacent oxide layers of the vertical stack within the spaces;
- a charge trapping layer disposed on the oxide layers of the vertical stack and in contact with the plurality of nanostructures;
- a block oxide layer conformally disposed on the charge trapping layer; and
- a metal gate formed on the block oxide layer between adjacent oxide layers of the vertical stack.

11. The memory device of claim 10, wherein the charge trapping layer comprises silicon nitride, and the block oxide layer comprises silicon oxide.

12. The memory device of claim 11, wherein the plurality of nanostructures comprise SiGe.

13. The memory device of claim 12, wherein a concentration of germanium in SiGe is 30% or greater.

14. The memory device of claim 12, wherein the nanostructures comprise nanowires, nanotubes, or nanotetrapods.

15. The memory device of claim 12, wherein the nanostructures have a characteristic dimension less than 10 μm.

16. The memory device of claim 12, wherein each nanostructure of the plurality of nanostructures has a dimension less than 1 μm.

17. The memory device of claim 12, wherein the gate oxide layer has a thickness of 800 μm or less.

18. The memory device of claim 12, wherein the metal gate has a thickness of about 100 μm to about 350 μm.

* * * * *